United States Patent
Yen et al.

(10) Patent No.: US 12,387,984 B2
(45) Date of Patent: Aug. 12, 2025

(54) TEST STRUCTURE AND INTEGRATED CIRCUIT TEST USING SAME

(71) Applicant: Taiwan Semiconductor Manufacturing Company LTD, Hsinchu (TW)

(72) Inventors: Wei-Kuan Yen, Hsinchu (TW); Yi-Cheng Chiu, Taipei (TW); Yen-Chiang Liu, Hsinchu (TW); Kang-Tai Peng, Zhubei (TW); Jui-Chun Weng, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 190 days.

(21) Appl. No.: 18/230,918

(22) Filed: Aug. 7, 2023

(65) Prior Publication Data

US 2025/0054817 A1   Feb. 13, 2025

(51) Int. Cl.
*H01L 21/66* (2006.01)
*G01R 31/28* (2006.01)
*H10D 84/01* (2025.01)
*H10D 84/03* (2025.01)

(52) U.S. Cl.
CPC .......... *H01L 22/34* (2013.01); *G01R 31/2884* (2013.01); *G01R 31/2894* (2013.01); *H01L 22/20* (2013.01); *H10D 84/013* (2025.01); *H10D 84/0156* (2025.01); *H10D 84/017* (2025.01); *H10D 84/0191* (2025.01); *H10D 84/038* (2025.01)

(58) Field of Classification Search
CPC ......... H01L 22/34; H01L 22/20; H01L 22/12; H01L 22/14; G01R 31/2884; G01R 31/2894; H10D 84/013; H10D 84/0156; H10D 84/017; H10D 84/0191; H10D 84/038

See application file for complete search history.

(56) References Cited

U.S. PATENT DOCUMENTS

| | | | |
|---|---|---|---|
| 2013/0299947 A1* | 11/2013 | Uehling | H01L 22/20 257/E23.179 |
| 2021/0257266 A1* | 8/2021 | Oh | G01R 31/31717 |
| 2023/0280372 A1* | 9/2023 | Blin | H01L 22/32 257/48 |

* cited by examiner

*Primary Examiner* — Giovanni Astacio-Oquendo
(74) *Attorney, Agent, or Firm* — Lippes Mathias LLP (57) ABSTRACT

In a method of fabricating at least one IC, doped regions are formed on a semiconductor wafer using a first photolithography mask, including at least one doped region of a test structure. Active regions are formed on the semiconductor wafer using a second photolithography mask, including active regions of the test structure. Electrical contacts are formed on the active regions of the test structure. Electrical resistances are measured between pairs of active regions of the test structure using the electrical contacts. At least one metric is determined indicating whether the doped regions are spatially aligned with the active regions based on the measured electrical resistances. In response to the at least one metric indicating the doped regions are spatially aligned with the active regions, completing fabrication of the at least one integrated circuit.

20 Claims, 10 Drawing Sheets

| Example | Shift | Resistance | ΔX, ΔY |
|---------|-------|------------|--------|
| 1 | HVPW no OVL shift | $R_{left}=R_{right}$<br>$R_{top}=R_{bot}$ | $\Delta X=0$<br>$\Delta Y=0$ |
| 2 | HVPW shift right | $R_{left}>R_{right}$<br>$R_{top}=R_{bot}$ | $\Delta X<0$<br>$\Delta Y=0$ |
| 3 | HVPW shift left | $R_{left}<R_{right}$<br>$R_{top}=R_{bot}$ | $\Delta X>0$<br>$\Delta Y=0$ |
| 4 | HVPW shift upwards | $R_{left}=R_{right}$<br>$R_{top}>R_{bot}$ | $\Delta X=0$<br>$\Delta Y<0$ |
| 5 | HVPW shift downward | $R_{left}=R_{right}$<br>$R_{top}<R_{bot}$ | $\Delta X=0$<br>$\Delta Y>0$ |

Monitor direction

FIG. 13

TEST STRUCTURE AND INTEGRATED CIRCUIT TEST USING SAME

BACKGROUND

The following relates to the semiconductor fabrication arts, semiconductor fabrication quality control arts, wafer acceptance testing arts, and related arts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fabrication of an integrated circuit (IC) typically involves performing a sequence of operations on a silicon or other semiconductor wafer, such as deposition of a material or sequence of materials, etching, dopant diffusion, dopant implantation, and so forth. The spatial extent over which each operation is performed is controlled by photolithography, in which a layer of photoresist is applied to the surface of the wafer and exposed to light through a photolithography mask (i.e., photomask) to form a latent image on the photoresist, followed by developing the photoresist to remove the resist where exposed to the light (for positive photoresist) or where not exposed to the light (for negative photoresist) so as to form openings in the photoresist layer. The deposition, etching, or other processing is then performed though the openings in the photoresist to provide spatial delineation of where these processes are applied. After use, the photoresist may be removed by a photoresist stripping process. The light used in the photolithography may in some embodiments be ultraviolet (UV) light, such as deep ultraviolet (DUV) or extreme ultraviolet (EUV) light. Use of shorter wavelength DUV or EUV light can provide smaller critical dimension (CD) sizes to enable, for example, a more compact layout of transistors and/or other devices. In practice, step-and-shoot processes can be used so that the photomask can be used to fabricate multiple IC chips on a single wafer, which is then diced to form individual IC dies.

One challenge in such IC fabrication is that when multiple photomasks are used for different operations, the latent images produced by the different photomasks should be precisely aligned with each other on the semiconductor wafer. Misalignment of the latent images results in the processing spatially delineated by the successive masks being misaligned relative to one another, which in turn can result in semiconductor wafer being defective and scrapped. The DUV, EUV, or other photolithography scanner includes precision robotic mechanisms to ensure alignment, but nonetheless misalignment can occur. To detect misalignment, a common approach is to employ suitable imaging, e.g., using an optical microscope or a scanning electron microscope (SEM), to detect the misaligned features on the wafer.

However, microscopy-based misalignment detection has some difficulties. It entails extra fabrication workflow steps as the wafer is transferred to the microscope for image acquisition and analysis. This can be alleviated in part by not performing the microscopy inspection on each wafer, but at the risk that misalignment may be missed in one or more wafers that are not inspected by the microscopy. Furthermore, some types of processing do not form features that can be detected in microscope images. For example, dopant implantation or diffusion steps may not produce features that can be detected by optical microscopy or SEM, and hence the optical or SEM inspection cannot detect misalignment of the latent images produced by different photomasks if one of those latent images is only used to spatially delineate dopant diffusion or dopant implantation.

In some embodiments disclosed herein, a test structure as disclosed herein is provided which enables detection of such misalignment electrically. Advantageously, the corresponding disclosed wafer acceptance test (WAT) can detect misalignment of the latent images produced by different photomasks even if one of those latent images is only used to spatially delineate dopant diffusion or dopant implantation. The WAT can be performed after the first metallization layer (i.e., the MO layer) has been formed in back end-of-line (BEOL) processing, or can be performed at any later stage of the BEOL processing. The electrical WAT is fast, and does not appreciably increase the number of steps or the complexity of the IC fabrication workflow. If other test structures are included on the wafer for performing other types of electrical WAT tests, the disclosed electrical WAT for detecting misalignment of the latent images produced by different photomasks can be performed concurrently with these other WAT tests for detecting other issues. As no additional workflow steps are added, the electrical WAT can also be performed on every wafer.

Furthermore, not only does the disclosed approach detect unacceptably large misalignment of the latent images produced by different photomasks, but it also identifies the direction of the misalignment, and may also provide a quantitative measure of the amount of the misalignment. Such additional information can be valuable in performing diagnostics to determine the source of the misalignment, for example possibly due to a misalignment in the photolithography scanner.

Figure 1:
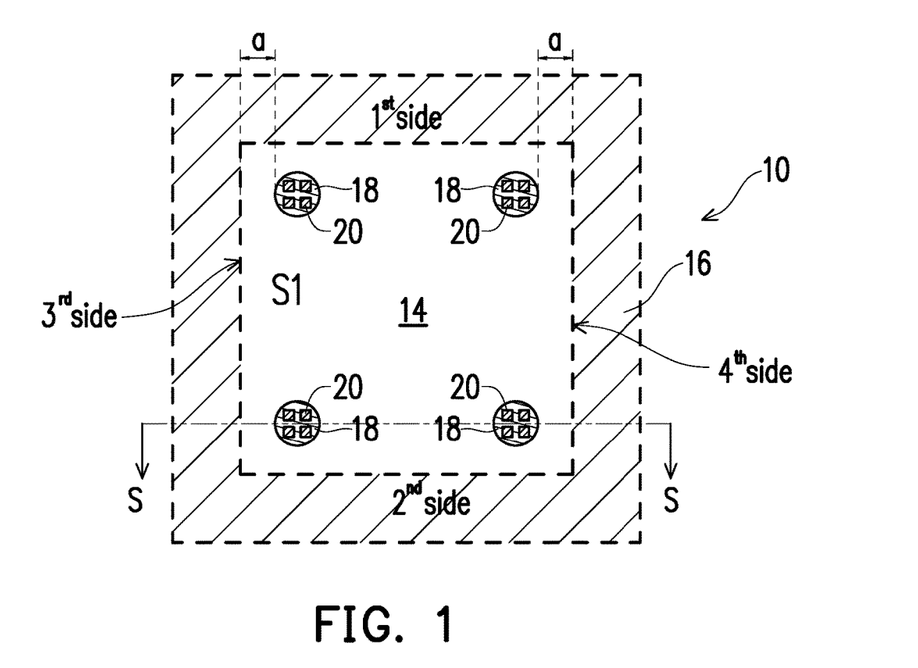
FIGS. 1 and 2 diagrammatically illustrate a test structure in top view (FIG. 1) and side sectional view (FIG. 2).
Figure 2:
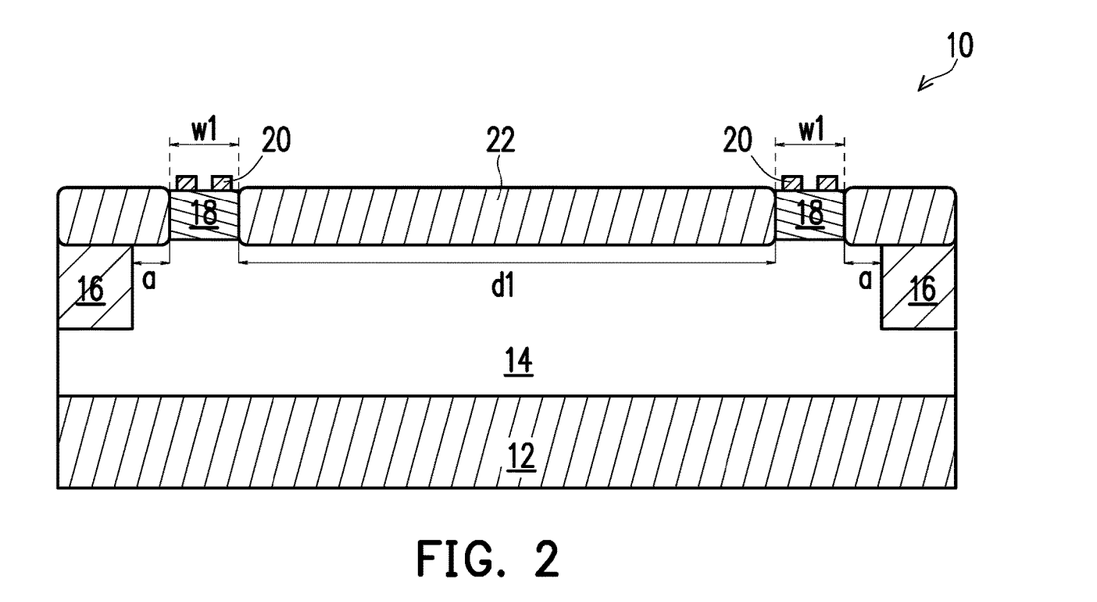

With reference to FIGS. 1 and 2, a test structure 10 according to an embodiment for detecting misalignment of the latent images produced by different photomasks is illustrated by way of a top view (FIG. 1) and a side sectional view (FIG. 2). The illustrative test structure 10 is formed on a semiconductor substrate 12, which is typically a wafer 12 on which an integrated circuit (IC) is being fabricated. In some cases, the IC fabrication may entail fabricating an array of IC dies on the wafer 12. A base semiconductor material 14 is disposed on the wafer 12. The base semiconductor material 12 may be formed on the wafer 12 by epitaxy, dopant implantation into the wafer 12, or so forth. It is also contemplated for the base semiconductor material 14 to be the wafer 12, e.g., in a case where the base semiconductor material 14 is doped n-type it could be that the base semiconductor material 14 is the upper portion of a silicon wafer 12 that is an n-type wafer. A doped region 16 of the test structure 10 is formed on the wafer 12, e.g., in and/or on the base semiconductor material 14. Active regions 18 of the test structure 10 are also formed on the wafer 12, e.g., in and/or on the base semiconductor material 14. Electrical contacts 20 are formed on the active regions 18. In the illustrative embodiment of FIG. 1, four electrical contacts 20 are formed on each active region 18 of the test structure; however, the number of electrical contacts formed on each active region can be as low as one, or can be two, or three, or four, or five, or more. The test structure 10 may optionally include other elements, such as an illustrative field oxide (FOX) 22. (Note that the optional FOX 22 is omitted in the top view of FIG. 1 as well as in all other top views of test structure embodiments presented herein).

Figure 3:
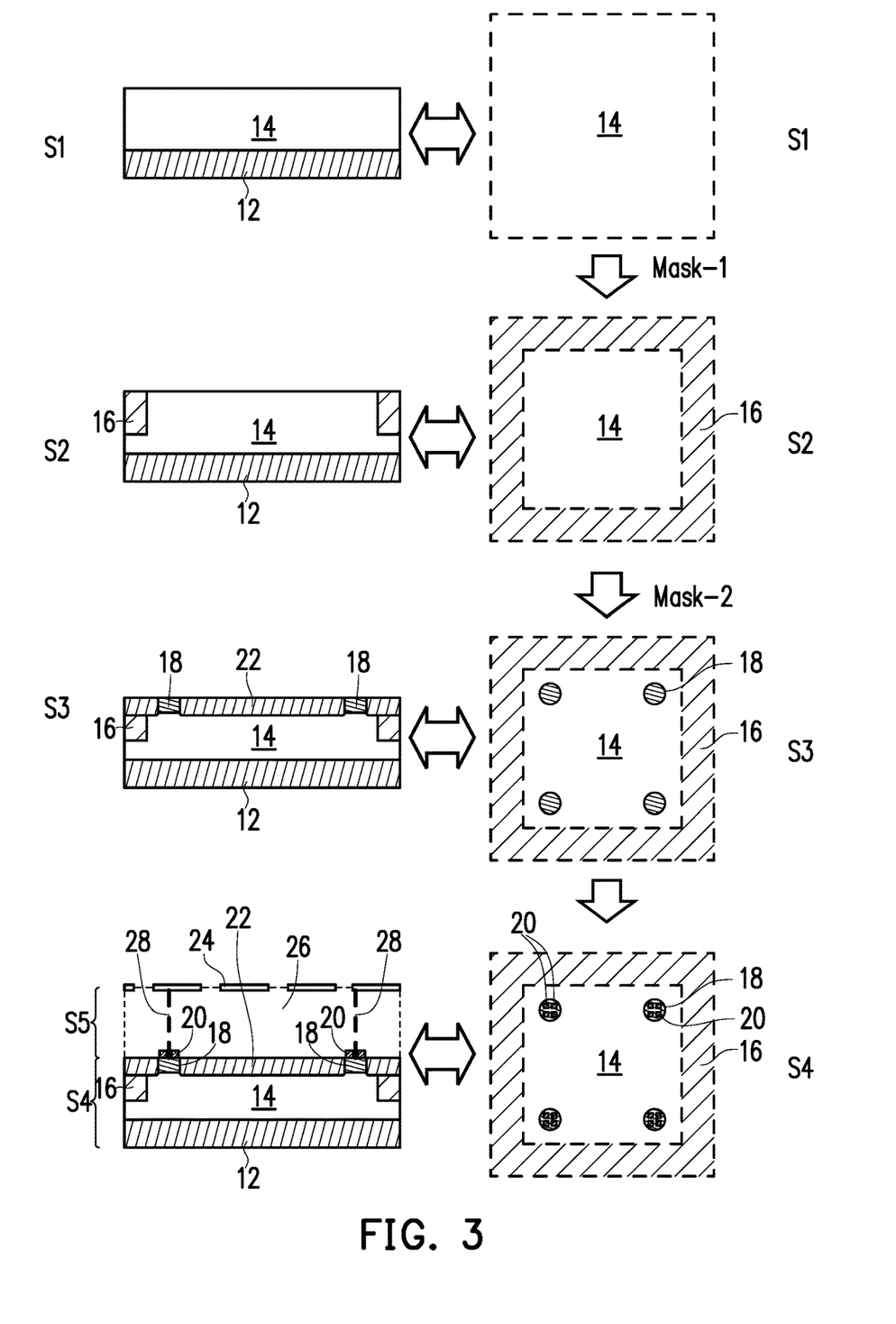
FIG. 3 diagrammatically illustrates a method of manufacturing the test structure of FIGS. 1 and 2 by way of a sequence of side sectional and top views.

With reference to FIG. 3, a nonlimiting illustrative example of an approach for fabrication of the test structure 10 of FIGS. 1 and 2 is shown by way of a sequence of cross-sectional and top views. In a step S1 shown in both sectional and top views, the wafer 12 is provided with the base semiconductor material 14 disposed thereon as a blanket layer. As previously noted, the base semiconductor material 14 may be formed by epitaxy, dopant diffusion or implantation, or any other suitable method. The base semiconductor material 14 is formed with a design-basis doping level.

With continuing reference to FIG. 3, in a step S2 shown by way of both sectional and top views, the doped region 16 is formed. This is done utilizing a first photomask, denoted in FIG. 3 as "Mask-1", and entails dopant implantation into the base semiconductor material 14 in those areas defined by the first photomask (Mask-1). For example, the processing to move from step S1 to step S2 may entail depositing a photoresist on the surface of the base semiconductor material 14, exposing the photoresist to ultraviolet light (e.g., DUV or EUV light, depending on the process) through the first photomask (Mask-1) to form a latent image of Mask-1 on the photoresist, developing the latent image using a suitable developer to form openings in the photoresist corresponding to the spatial extent of the intended doped regions, and performing dopant implantation through the mask openings to form the doped regions 16. The photoresist is then typically stripped to produce the structure shown in FIG. 3 for step S2.

It will be noted that the dopant implantation of step S2 is performed with the dopant species being implanted (or, in an alternative embodiment, diffused) into a portion of the base semiconductor material 14. Typically, the dopant implantation (or diffusion) does not produce features that would be visible in an optical or SEM microscope image. Hence, optical or SEM microscopy generally cannot be used to determine whether the latent image produced by the first photomask (Mask-1) is aligned with the latent image produced by a second photomask (Mask-2) in further processing described next.

With continuing reference to FIG. 3, in a step S3 shown by way of both sectional and top views, the active regions 18 are formed, along with the field oxide (FOX) 22. Note that in FIG. 3, the top view for step S3 (and also for subsequent step S4) omits the FOX 22 to show the doped regions 14, 16, and 18. Formation of the active regions 18 can employ dopant diffusion or implantation into the base semiconductor material 14, and definition of the spatial extent of the active regions 18 is done utilizing a second photomask, denoted in FIG. 3 as "Mask-2". Spatial delineation of the active regions 18 using the second mask (Mask-2) can be done in various ways.

In one nonlimiting illustrative approach, the processing of step S3 may include forming the FOX 22 only in areas delineated by using the second mask (Mask-2). The FOX 22 may be formed by a technique such as shallow trench isolation (STI) in which trenches are etched in areas defined by the second mask Mask-2, where the trenches correspond to the areas of the FOX 22. The trenches are filled with silicon dioxide, and the silicon dioxide deposited outside of the trenches is removed using chemical mechanical planarization (CMP). Other approaches can be used to locally form the FOX 22 in spatially defined areas, such as local oxidation of silicon (LOCOS). In these approaches, the FOX 22 is not formed in the areas corresponding to the spatial extent of the intended active regions, and a subsequent dopant implantation or diffusion into the base semiconductor material 14 forms the active regions 18 in those areas not covered by the FOX 22.

In another nonlimiting illustrative approach, the processing of step S3 may entail forming the FOX 22 as a blanket field oxide and depositing a photoresist on the surface of the FOX 22, exposing the photoresist to ultraviolet light (e.g., DUV or EUV light, depending on the process) through the second photomask (Mask-2) to form a latent image of Mask-2 on the photoresist, and developing the latent image using a suitable developer to form openings in the photoresist corresponding to the spatial extent of the intended active regions. Next, the FOX 22 is removed by etching in the areas corresponding to the openings in the photoresist. Next, dopant implantation or diffusion into the base semiconductor material 14 is performed through the openings passing through the mask and FOX 22 to form the active regions 18.

It will be appreciated that the foregoing are merely nonlimiting examples of some suitable approaches for forming the active regions 18. Notably, since the active regions 18 are spatially delineated using the second mask (Mask-2) while the doped region 16 is spatially delineated using the first mask (Mask-1), any misalignment between the latent image produced on the wafer using first mask (Mask-1) and the latent image produced on the wafer using second mask (Mask-2) will result in a misalignment of the active regions 18 relative to the doped region 16 (or, viewed in the reverse, will result in a misalignment of the doped region 16 relative to the active regions 18).

With continuing reference to FIG. 3, in a step S4 shown by way of both sectional and top views (where again the top view omits the FOX 22), the electrical contacts 20 are deposited on the active regions 18. The deposition of the electrical contacts 20 can be by any suitable metal contact formation process, such as vacuum evaporation, sputtering, chemical vapor deposition (CVD), physical vapor deposition (PVD), or so forth. As previously noted, while FIGS. 1 and 3 illustrate four electrical contacts 20 formed on each active region 18 of the test structure 10, more generally the number of electrical contacts formed on each active region can be as few as one, or can be two, three, four, five, or so forth.

The foregoing suitably produces the test structure 10 as illustrated in FIGS. 1 and 2. However, to perform an electrical wafer acceptance test (WAT) using the test structure 10, the back end-of-line (BEOL) processing is typically performed at least up to the first patterned metallization layer (i.e., the MO layer). To this end, after the electrical contacts 20 are formed on the active regions, at least one patterned metallization layer 24 is formed, which is spaced apart from the electrical contacts 20 by a dielectric material 26. The electrical contacts 20 disposed on the active regions 18 of the test structure 10 are electrically connected with the at least one patterned metallization layer 24 by electrically conductive vias 28 that pass through the dielectric material 26 and connect the electrical contacts 20 formed on the active regions with the at least one patterned metallization layer 24. This is diagrammatically shown by sectional view only as the sectional diagram portion labeled S5 in FIG. 3. The formation of the BEOL metallization structure 24, 26, 28 can utilize any suitable BEOL processing approach. As one nonlimiting illustrative example, this may entail depositing a blanket layer of the dielectric material 26 (also sometimes referred to as intermetal dielectric material or IMD in BEOL processing descriptions), using photolithography to form via openings which are filled with tungsten or another chosen via material to from the vias 28, followed by deposition and photolithographic patterning of a metal layer to form the patterned metallization layer 24. While a single patterned metallization layer 24 is shown in FIG. 3, sectional view labeled S5, it will be appreciated that the BEOL processing may repeat this process N times to form N metallization layers.

In the example fabrication flow of FIG. 3, the doped region 16 is first formed using the first photomask (Mask-1), followed by forming the active regions 18 using the second photomask (Mask-2). However, it will be appreciated that this order could be reversed—that is, the active regions 18 could be formed first using the second photomask (Mask-2), followed by forming the doped region 16 using the first photomask (Mask-1).

The test structure 10 is intended to detect misalignment of the latent images produced by the first photomask (Mask-1) that spatially delineates formation of doped regions 16, and the second photomask (Mask-2) that spatially delineates formation of active regions 18. It is to be understood that these masks (Mask-1 and Mask-2) are not primarily intended to be used to form the test structure 10, but rather are intended to be used to form (at least in part) an IC under fabrication. Hence, for example, the step S2 described with reference to FIG. 3 may form doped regions of the IC, and also forms the doped regions 16 of the test structure 10; and, the steps S30 and S3 described with reference to FIG. 3 may form active areas such as source and drain regions of the IC, and also forms the active areas 18 of the test structure 10.

To further illustrate this, in one nonlimiting illustrative IC fabrication example, the IC may include one or more high voltage (HV) CMOS (complementary metal-oxide-semiconductor) and/or DMOS (double-diffused MOS) transistors. In this IC fabrication workflow, the first photomask (Mask-1) may be used to delineate dopant implantation to form high-voltage p-well (HVPW) regions for isolating the CMOS and/or DMOS transistors; and, the second photomask (Mask-2) may be used to form the source and drain regions of the CMOS and/or DMOS transistors. Hence, any misalignment of the latent images produced on photoresist disposed on the wafer using Mask-1 and Mask-2 will result in misalignment of the source and drain regions of the CMOS and/or DMOS transistors respective to the HVPW regions. If the CMOS and/or DMOS transistors are tightly packed in the IC, the tolerances may be small and hence even a relatively small misalignment can result in the source and drain regions being closer to the HVPW regions than is acceptable for device performance. (In extreme misalignment, some or all source and drain regions may even overlap the HVPW regions).

In this example of IC fabrication of CMOS and/or DMOS transistors isolated by HVPW regions, the base semiconductor material 14 will be n-type. The doped region 16 of the test structure 10 will be doped p-type with the same doping level as the HVPW regions of the CMOS and/or DMOS transistors, which are formed concurrently with the doped region 16 of the test structure 10 using Mask-1. The active regions 18 of the test structure 10 will be doped n-type with a higher n-type doping level than the n-type base semiconductor material 14. The active regions 18 will be doped n-type at the same doping level as the active regions (e.g., source and drain regions) of the CMOS and/or DMOS transistors, which are formed concurrently with the active regions 18 of the test structure 10 using Mask-2.

While the illustrative examples herein are directed to the above example of CMOS and/or DMOS transistors with n-type active regions (e.g. n-type source/drain regions) and isolation via a p-type well (HVPW regions), in other embodiments the opposite doping polarity could be employed.

A specific example of another such embodiment is described, in which the CMOS and/or DMOS transistors have p-type active regions (e.g. p-type source/drain regions) and are isolated by high-voltage n-type wells (HVNW). In this example, the doped regions 16 are n-type at the same doping level as the implanted HVNW regions of the IC, and are formed in and/or on a p-type base semiconductor material 14. The active regions 18 are p-type and are formed in and/or on the p-type base semiconductor material 14 and have a higher p-type doping level than the p-type base semiconductor material 14.

Moreover, these are merely nonlimiting illustrative examples, and other IC fabrication workflows can usefully benefit from the test structure 10 used to detect misalignment of the latent images produced by first and second photomasks used in the IC fabrication workflow process.

Figure 4:
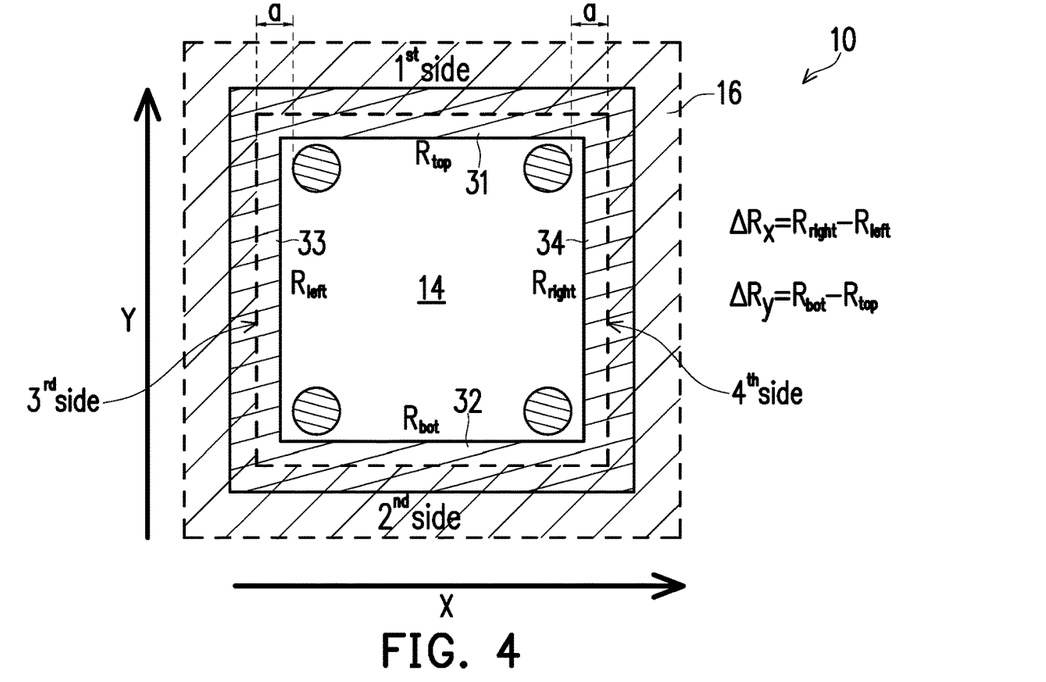
FIG. 4 diagrammatically illustrates the test structure of FIGS. 1 and 2 with the test measurements to be performed diagrammatically indicated.

With reference back to FIGS. 1 and 2 and with further reference now to FIG. 4, operation of the test structure 10 to detect misalignment of the latent images produced by different photomasks is described. As indicated in the top view FIG. 1 (also shown in FIG. 4), the doped region 16 of the test structure 10 has a square inner perimeter, and the active regions 18 of the test structure comprise four active regions disposed at four respective corners inside the square inner perimeter. As indicated in each of FIGS. 1, 2, and 4, the square inner perimeter has four sides, labeled: "$1^{st}$ side"; "$2^{nd}$ side", "$3^{rd}$ side", and "$4^{th}$ side". Without loss of generality, FIG. 4 identifies two directions: an X-direction, and a Y-direction which is perpendicular to the X-direction. The square inner perimeter of the doped region 16 of the test structure 10 has mutually parallel first and second sides (labeled "$1^{st}$ side" and "$2^{nd}$ side") oriented along a first direction (e.g., the X-direction), and mutually parallel third and fourth sides (labeled "$3^{rd}$ side" and "$4^{th}$ side") oriented along a second direction (e.g., the Y-direction) that is perpendicular to the first direction. FIGS. 1 and 4 show the test structure 10 formed on the wafer 12 in the case in which the latent images produced by different photomasks (Mask-1 and Mask-2) are aligned. In this case, Mask-1 and Mask-2 are designed to place the active regions 18 of the test structure 10 inside the inner perimeter of the doped region 16 of the test structure 10, with the left edges of the two active regions 18 closest to the third side spaced apart from the third side by a distance a, and with the right edges of the two active regions 18 closest to the fourth side spaced apart from the fourth side by the same distance a. This is indicated in each of FIGS. 1, 2, and 4.

As previously noted, the base semiconductor material 14 is of opposite doping polarity than the doped region 16. In one example, the base semiconductor material 14 is doped n-type and the doped region 16 is doped p-type (e.g., being formed along with HVPW regions of CMOS and/or DMOS transistors of the IC in the example IC fabrication process). In another example, the base semiconductor material 14 is doped p-type and the doped region 16 is doped n-type (e.g., being formed along with HVNW regions of CMOS and/or DMOS transistors with p-type active regions). Hence, as labeled in FIG. 4: a depletion region 31 is formed along the first side of the inner perimeter of the doped region 16; a depletion region 32 is formed along the second side of the inner perimeter of the doped region 16; a depletion region 33 is formed along the third side of the inner perimeter of the doped region 16; and a depletion region 34 is formed along the fourth side of the inner perimeter of the doped region 16. The depletion regions 31, 32, 33, and 34 are formed because there is a p/n (or n/p) junction formed at the interface between the doped region 16 and the base semiconductor material 14.

As indicated in FIG. 4, during the wafer acceptance test (WAT), a resistance $R_{left}$ is measured between the two active regions 18 closest to the third side, and a resistance $R_{right}$ is measured between the two active regions 18 closest to the fourth side. As previously noted, for the aligned case of FIG. 4, the same distance a separates: (i) the third side of the inner perimeter from the left edges of the two active regions 18 closest to the third side, and (ii) the fourth side of the inner perimeter from the right edges of the two active regions 18 closest to the fourth side. Furthermore, the spacing between the two active regions 18 closest to the third side is equal to the spacing between two active regions 18 closest to the fourth side. Consequently, for the aligned case of the test structure 10 of FIG. 4, the symmetry ensures that $R_{left}=R_{right}$. Denoting $\Delta R_x=R_{right}-R_{left}$, it follows that $\Delta R_x=0$ for the aligned case of the test structure 10 of FIG. 4.

The test structure 10 for the aligned case of the test structure 10 is fourfold symmetric. Hence, although not labeled in FIGS. 1 and 4, for the aligned case the same distance a separates: (i) the first side of the inner perimeter from the upper edges of the two active regions 18 closest to the first side, and (ii) the second side of the inner perimeter from the bottom edges of the two active regions 18 closest to the second side. Consequently, a resistance $R_{top}$ measured between the two active regions 18 closest to the first side equals a resistance $R_{bot}$ measured between the two active regions 18 closest to the second side. Hence, the symmetry ensures that $R_{top}=R_{bot}$. Denoting $\Delta R_y=R_{bot}-R_{top}$, it follows that $\Delta R_y=0$ for the aligned case of the test structure 10 of FIG. 4.

In summary, because Mask-1 and Mask-2 are in alignment in the X-direction, it follows that $\Delta R_x=R_{right}-R_{left}=0$. Similarly, because Mask-1 and Mask-2 are in alignment in the Y-direction, it follows that $\Delta R_y=R_{bot}-R_{top}=0$. Another way of viewing this is that due to the symmetry, the impact on the resistance measurement $R_{left}$ of the depletion region 33 along the third side is equal to the impact on the resistance measurement $R_{right}$ of the depletion region 34 along the fourth side; and similarly, the impact on the resistance measurement $R_{top}$ of the depletion region 31 along the first side is equal to the impact on the resistance measurement $R_{bot}$ of the depletion region 32 along the second side.

Figure 5:
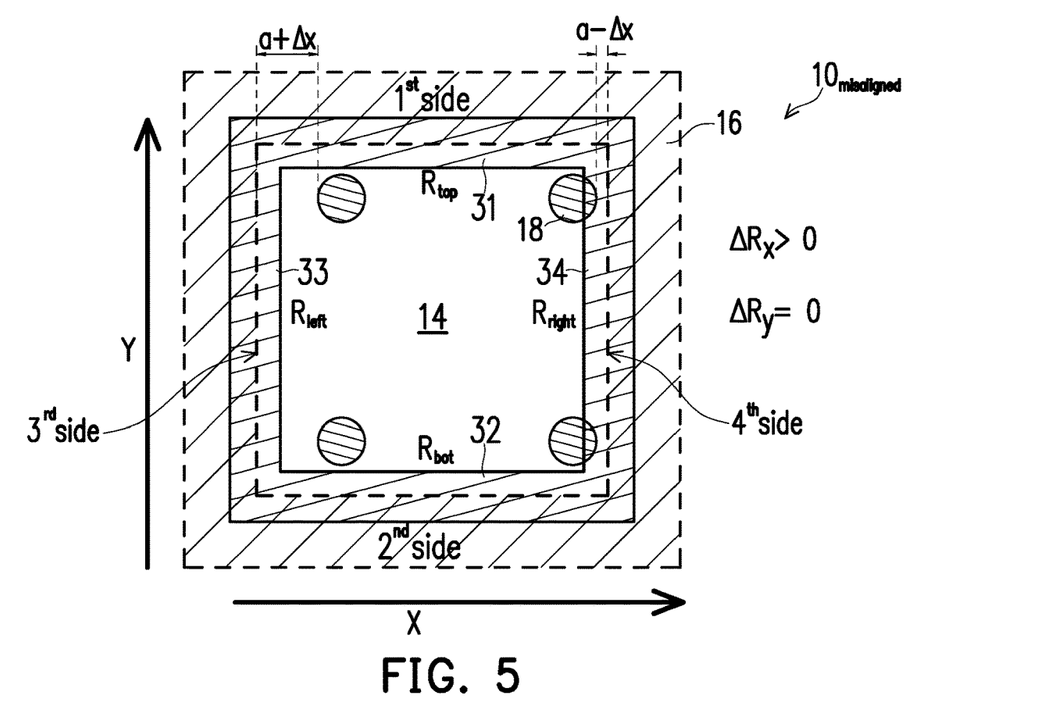
FIG. 5 diagrammatically illustrates the test structure of FIGS. 1 and 2 with the test measurements to be performed diagrammatically indicated, for the case of a mask misalignment in the indicated X-direction.

With reference now to FIG. 5, however, these equalities may not hold if Mask-1 and Mask-2 are misaligned. Specifically, in the example of FIG. 5, during the processing shown in FIG. 3 the latent image formed by Mask-1 is misaligned respective to the latent image formed by Mask-2 along the X-direction by an amount $\Delta x$, with the direction of the misalignment $\Delta x$ moving the active regions 18 away from the third side of the inner perimeter of the doped region 16 and toward the fourth side of the inner perimeter of the doped region 16. This results in a modified test structure $10_{misaligned}$ as shown in FIG. 5. As there seen, the resistance measurement $R_{left}$ will be measuring resistance of mostly or entirely the base semiconductor material 14; whereas, the resistance measurement $R_{right}$ will be measuring resistance of mostly or entirely the depletion region 34 along the fourth side of the inner perimeter of the doped region 16. This will result in the measured resistance $R_{right}$ being higher than the measured resistance $R_{left}$. Consequently, $\Delta R_x=R_{right}-R_{left}>0$.

Although not illustrated, the misalignment could be in the opposite direction, so that the active regions 18 are shifted toward the third side of the inner perimeter of the doped region 16 and away from the fourth side of the inner perimeter of the doped region 16. This would result in $R_{left}$ measuring resistance of mostly or entirely the depletion region 33 along the third side of the inner perimeter of the doped region 16; whereas, the resistance measurement $R_{right}$ would be measuring resistance of mostly or entirely the base semiconductor material 14. This would result in the measured resistance $R_{left}$ being higher than the measured resistance $R_{right}$, so that $\Delta R_x<0$ would be obtained.

In the example of FIG. 5, there is no misalignment along the Y-direction, and so $\Delta R_y=R_{bot}-R_{top}=0$ holds. However, by symmetry it will be appreciated that a misalignment $\Delta y$ of the latent images of Mask-1 and Mask-2 along the Y-direction would similarly produce a nonzero value for $\Delta R_y$.

Figure 6:
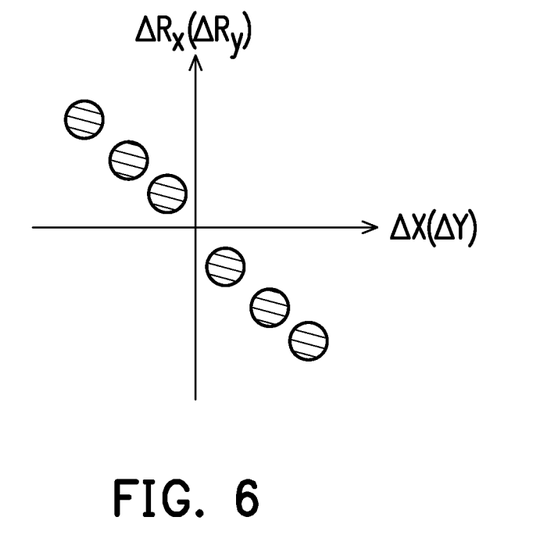
FIG. 6 diagrammatically illustrates a plot of a calibration table or curve of measured resistance versus mask misalignment magnitude for use in analyzing test measurements obtained using the test structure of FIGS. 1 and 2.
Figure 7:
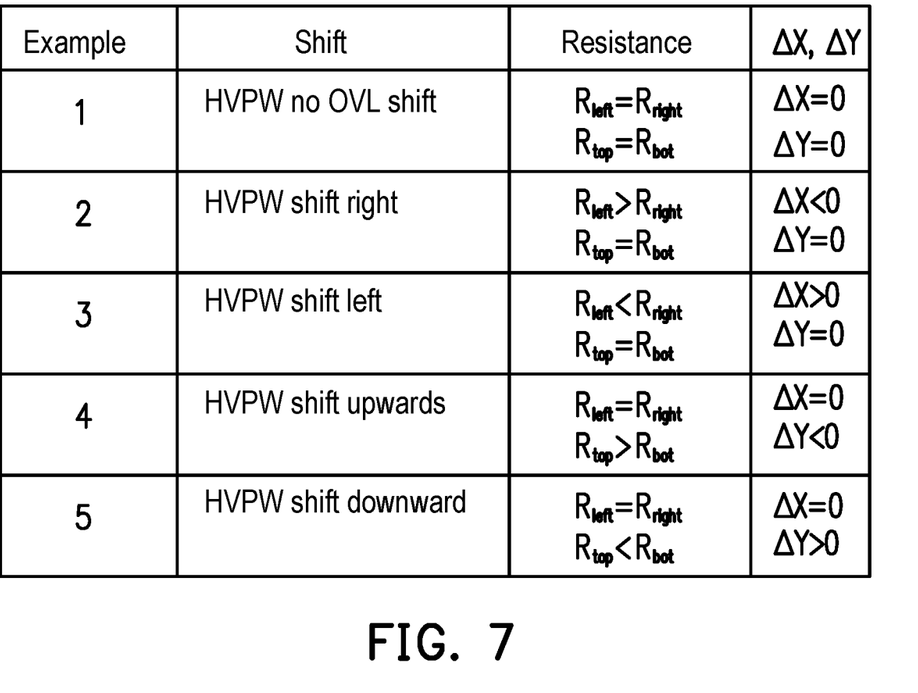
FIG. 7 presents a table of measured resistance polarities for different types of mask alignment in an illustrative example.

With reference to FIGS. 6 and 7, a calibration curve can be generated empirically (or by electromagnetic simulation of the semiconductor structure) relating $\Delta R_x$ (or $\Delta R_y$) with the shift $\Delta x$ along the X-direction (or the shift $\Delta y$ along the Y-direction). Using this empirical curve, the $\Delta R_x$ and $\Delta R_y$ measurements can be converted to respective misalignment shifts $\Delta x$ along the X-direction and $\Delta y$ along the Y-direction. Advantageously, both the magnitude and direction of the shift $\Delta x$ or $\Delta y$ can be determined based on the magnitude and sign, respectively, of the corresponding $\Delta R_x$ or $\Delta R_y$ value. FIG. 7 presents a table for determining the direction using the test structure 10 of FIG. 1. In FIG. 7, HVPW denotes "high voltage p-well" and corresponds to the doped region 16 in the case of fabrication of high voltage CMOS and/or DMOS transistors with HVPW regions providing isolation, and OVL denotes the active regions 18.

Figure 8:
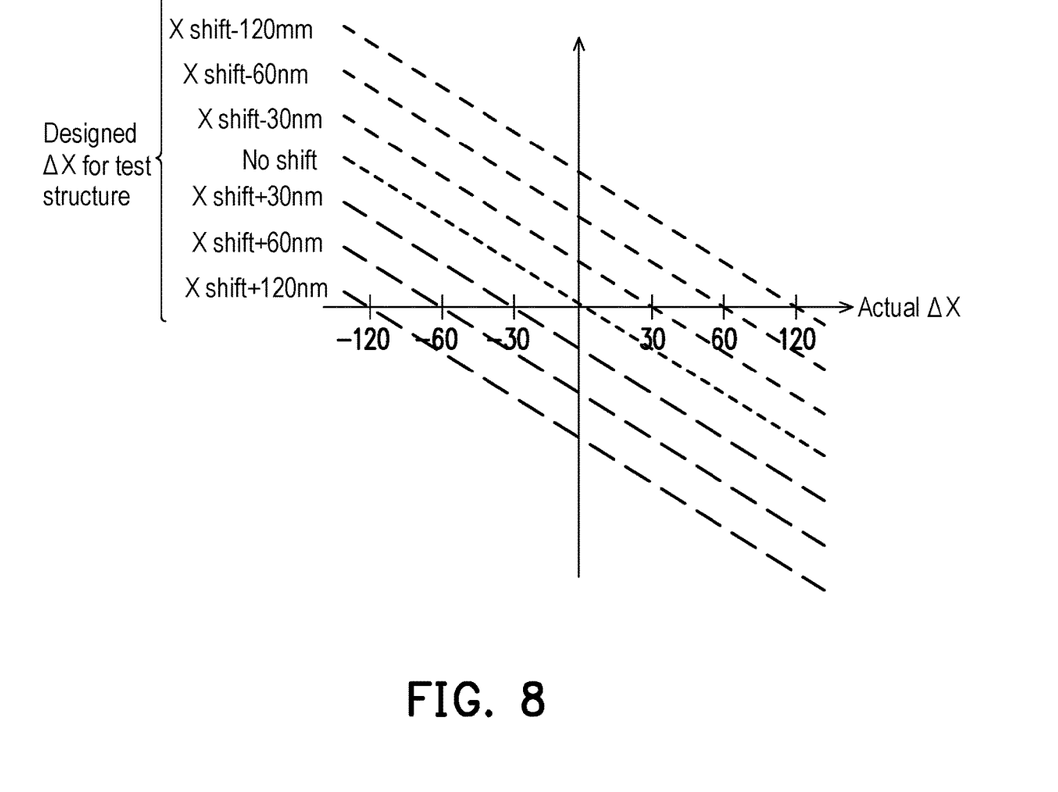
FIG. 8 diagrammatically illustrates an approach of using different test structures with different designed Δx shifts to determine the mask misalignment without use of a calibration table or curve.

With reference now to FIG. 8, a variant approach for converting the measured $\Delta R_x$ to the shift $\Delta x$ along the X-direction is diagrammatically illustrated. This approach employs multiple test structures analogous to the test structure 10 of FIGS. 1 and 2, but with different built-in shifts referred to on the ordinate axis as "Designed $\Delta x$ for test structure". With the "Designed $\Delta x$ for test structure" being "No shift", this corresponds exactly to the symmetric test structure 10 of FIG. 1. On the other hand, for example, the test structure in which "Designed $\Delta x$ for test structure" is "X-shift-60 nm" would have a built-in shift of −60 nm when Mask-1 and Mask-2 are exactly aligned. This results in measuring $\Delta R_x=0$ for an actual shift $\Delta x=60$ nm, as shown in FIG. 8. With this approach, the layout with the lowest measured $\Delta R_x$ is selected, and the corresponding Designed $\Delta x$ is then the actual shift $\Delta x$.

Figure 9:
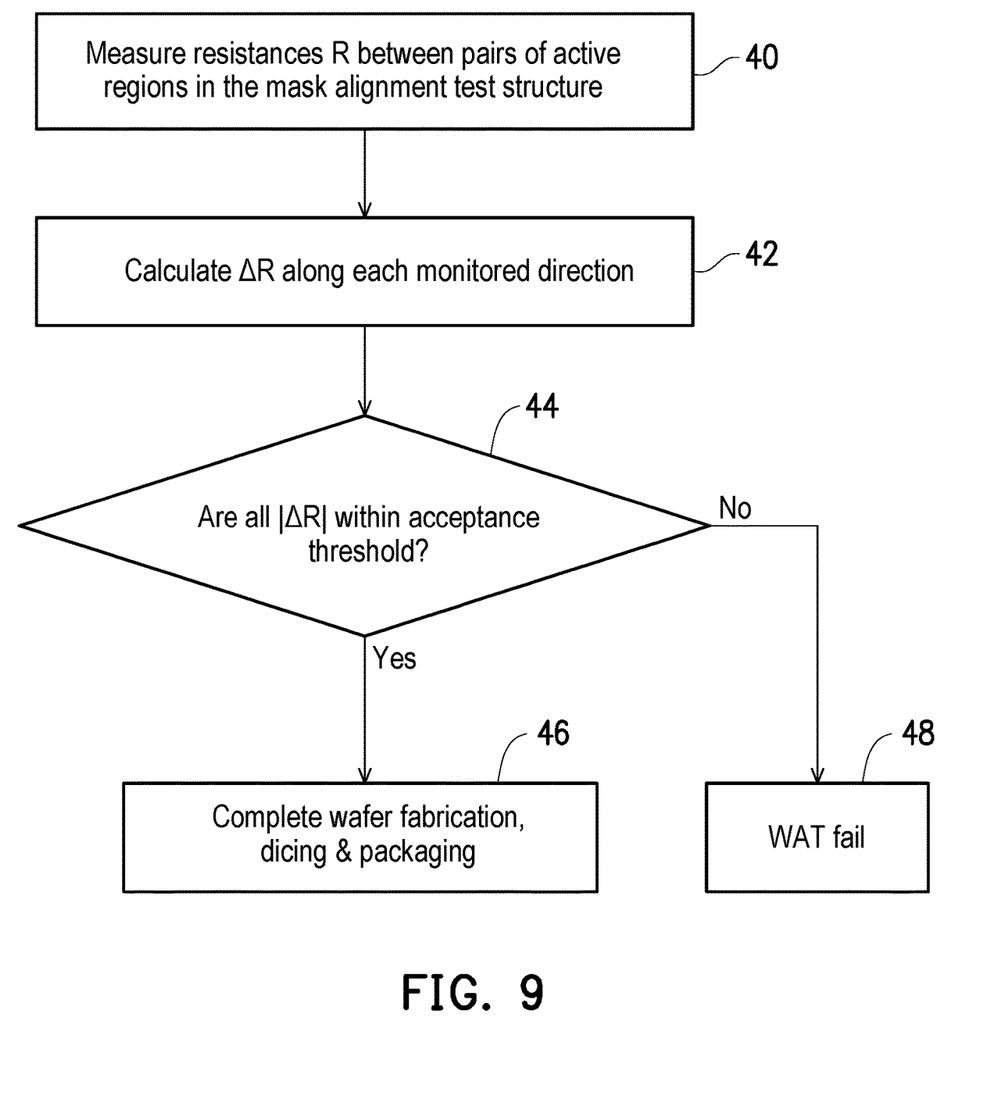
FIG. 9 presents a flow chart for a wafer acceptance test performed using a test structure as disclosed herein.

With reference now to FIG. 9, use of such a test structure in performing a wafer acceptance test (WAT) is summarized. In an operation 40, the resistances between pairs of active regions 18 in the mask alignment test structure are measured. For the illustrative test structure 10 of FIG. 1, these measurements are $R_{top}$, $R_{bot}$, $R_{left}$, and $R_{right}$. In an operation 42, the resistance difference $\Delta R$ is calculated for each monitored direction. In the test structure of FIGS. 1 and 4, the monitored directions are the X-direction and the Y-direction, and the corresponding computed resistance differences are $\Delta R_x$ and $\Delta R_y$. In a decision block 44, it is determined whether all $|\Delta R|$ are within respective thresholds for wafer acceptance. (Here the notation $|\cdot|$ denotes absolute value). If all $\Delta R$ values are within the respective wafer acceptance thresholds, then in an operation 46 fabrication of the IC is completed. For example, if the BEOL processing has only been done up to the MO metallization layer before performing the WAT, then the operation 46 may include completing the BEOL processing to complete all N metallization layers (where in general N>1 is usually the case) and then dicing the IC chips into singulated dies and possibly packaging the dies. On the other hand, if the BEOL processing is completed before performing the WAT, then the operation 46 may include the dicing of the IC chips and the optional die packaging.

Conversely, if at the decision block 44 it is determined that one or more of the $|\Delta R|$ values is not within the corresponding threshold for wafer acceptance, then the WAT fails in an operation 48. Typically, the operator will be notified of the WAT failure, and may optionally be notified of the direction and magnitude of the misalignment of Mask-1 and Mask-2.

Figure 10:
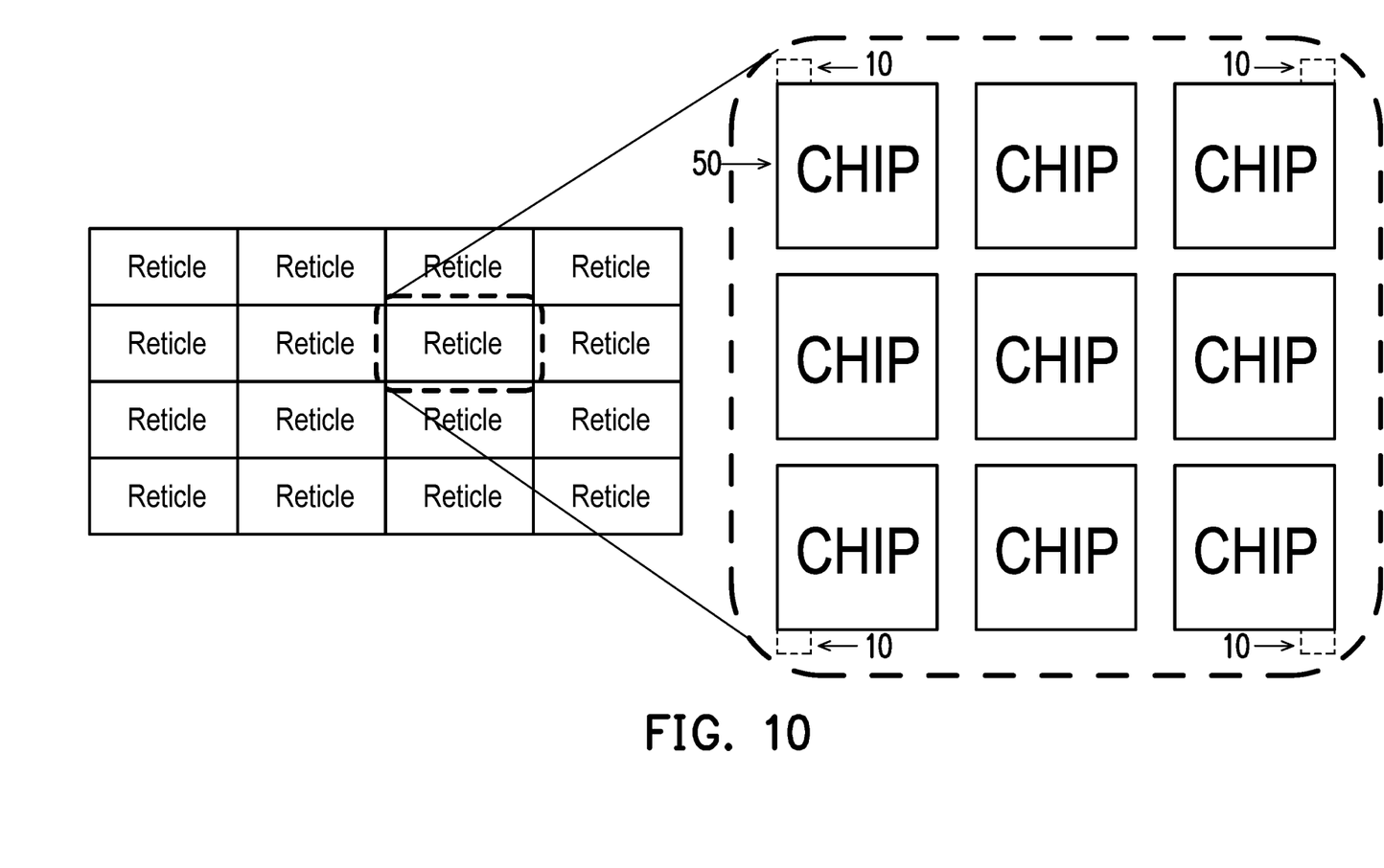
FIG. 10 diagrammatically presents a set of test structures on a wafer on which a two-dimensional array of integrated circuit (IC) chips is manufactured.

With reference now to FIG. 10, a set of test structures 10 on a wafer on which a two-dimensional array of IC chips 50 is manufactured is diagrammatically shown. The illustrative 3×3 array of IC chips 50 is fabricated by one latent image of Mask-1 and Mask-2 (referred to generically as "reticle" in FIG. 10). Each such reticle image has four test structures 10 at the four corners. Advantageously, this can also enable detection of any rotational misalignment between Mask-1 and Mask-2, as the degree of rotation can be determined by comparing the shifts of the latent images in the X- and Y-directions.

Figure 11:
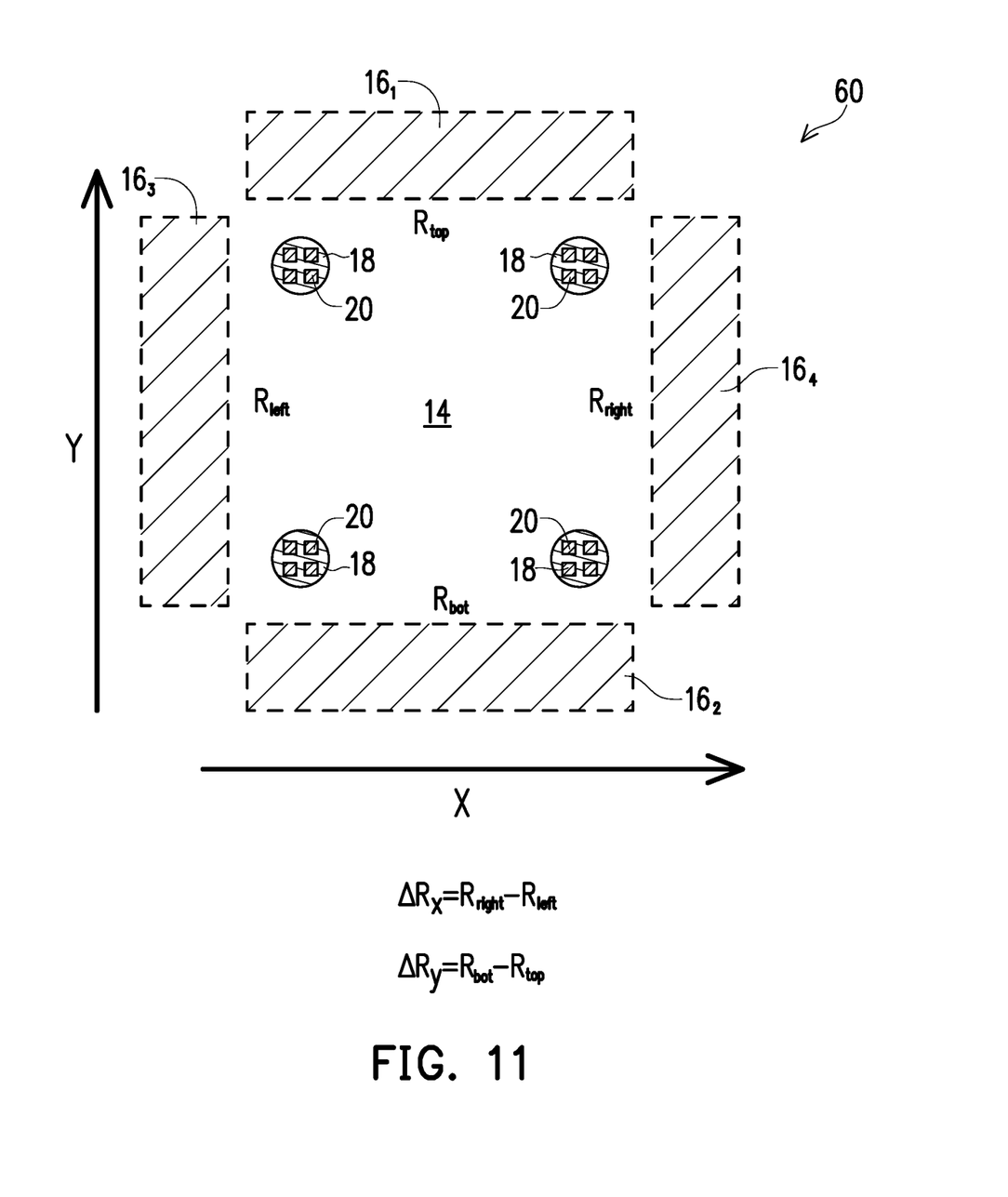
FIGS. 11, 12, and 13 diagrammatically illustrate test structures in top view according with some further embodiments.

With reference to FIG. 11, a variant test structure 60 is diagrammatically illustrated. The test structure 60 is similar to the test structure of FIG. 1, and again includes the base semiconductor material 14, the doped region 16, and the active areas 18 with electrical contacts 20. However, in the test structure 60 the doped region is formed as four separate (i.e., unconnected) doped regions, namely: a doped region 161 providing the first side of the interior perimeter; a doped region 162 providing the second side of the interior perimeter; a doped region 163 providing the third side of the interior perimeter; and a doped region 164 providing the fourth side of the interior perimeter. The test structure 60 is utilized in the same way as the test structure 10, that is, by measuring the resistances $R_{top}$, $R_{bot}$, $R_{left}$, and $R_{right}$ and utilizing these values as previously described.

Figure 12:
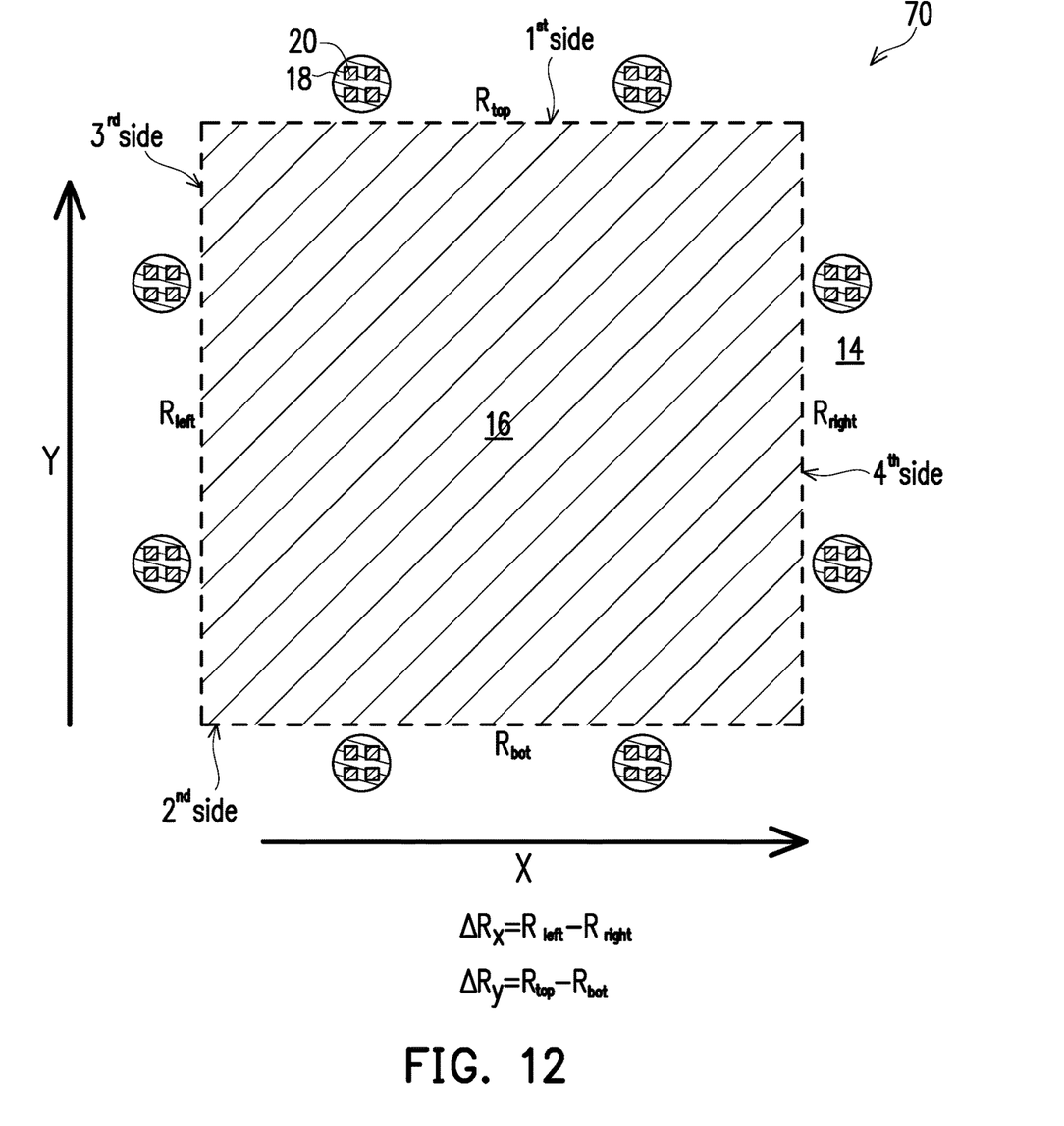

With reference to FIG. 12, a variant test structure 70 is diagrammatically illustrated. The test structure 70 is similar to the test structure of FIG. 1, and again includes the base semiconductor material 14, the doped region 16, and the active areas 18 with electrical contacts 20. However, in the test structure 60 the doped region 16 is formed as a contiguous square with no open interior. Hence, the utilized perimeter is the outer perimeter of the contiguous doped region 16 includes first and second sides parallel with the X-direction and third and fourth sides parallel with the perpendicular Y-direction, as shown in FIG. 12. Additional active regions 18 are added, with one pair spaced apart along the first side to measure $R_{top}$, one pair spaced apart along the second side to measure $R_{bot}$, one pair spaced apart along the third side to measure $R_{left}$, and one pair spaced apart along the fourth side to measure $R_{right}$. In this case, due to the active regions 18 being located outside of the doped region 16 it follows that the orientation of the resistance difference will reverse compared with the test structure 10 of FIG. 1. By defining $\Delta R_x=R_{left}-R_{right}$ and $\Delta R_y=R_{top}-R_{bot}$ this is accommodated, and the WAT previously described can be applied using $\Delta R_x=R_{left}-R_{right}$ and $\Delta R_y=R_{top}-R_{bot}$.

The previous test structures 10, 60, and 70 of respective FIGS. 1, 11, and 12 are designed to monitor mask misalignment in two orthogonal directions, denoted herein without loss of generality as the X- and Y-directions.

Figure 13:
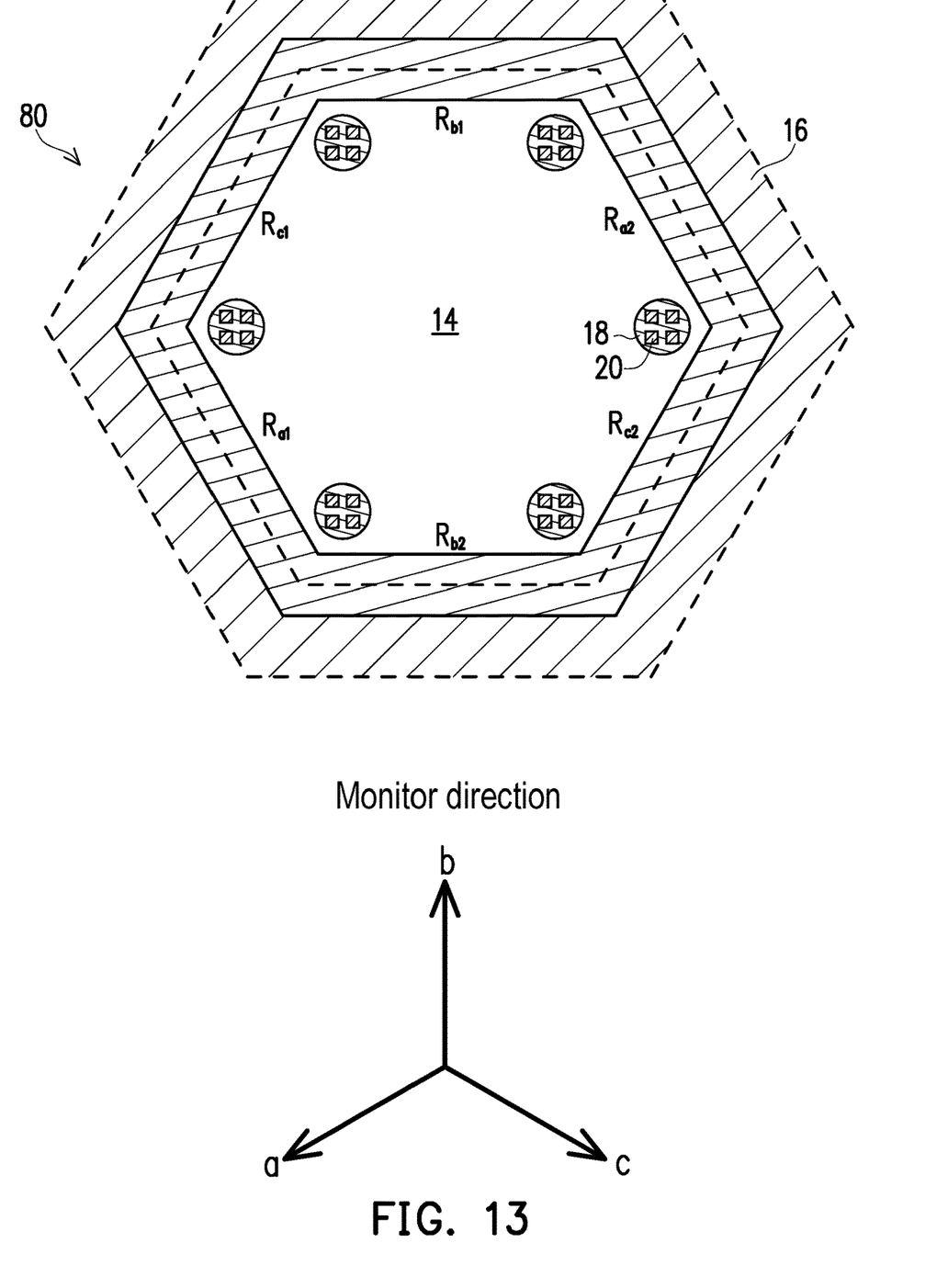

With reference now to FIG. 13, more than two directions can be monitored. A test structure 80 of FIG. 13 again includes the base semiconductor material 14, the doped region 16, and the active areas 18 with electrical contacts 20. However, in the test structure 80 of FIG. 13, the doped region is a regular hexagon and has a regular hexagon inner perimeter with six corners. This enables monitoring along three directions denoted as the directions a, b, and c in the lower portion of FIG. 13, with the three directions being spaced apart at 120° intervals.

More generally, the test structure can have a regular polygon shape, where a regular polygon is a polygon that is direct equiangular (all angles are equal in measure) and equilateral (all sides have the same length). The illustrative regular polygon examples include a square (test structures 10, 60, and 70 of respective FIGS. 1, 11, and 12) and a regular hexagon (test structure 80 of FIG. 13). In some nonlimiting illustrative embodiments, there are at least four independent active regions 18 surrounded by (or, in the embodiment of FIG. 12, surrounding) a doped region 16 shaped as a regular polygon (e.g., four active regions 18 for a square doped region 16; or six active regions 18 for a doped region 16 shaped as regular as shown in FIG. 13) with a plurality of electrical contacts 20 disposed on the active regions 18. The active regions 18 may suitably comprise consist a first type dopant (e.g., n-type) and are suitably formed within a first doping layer 16 (i.e., the base semiconductor material 16, e.g. an n-type doping layer) with the first doping type. A second doping layer 16 (e.g., a p-type doping layer) with a second type dopant (e.g. p-type) surrounds the active regions 18 (or, in the embodiment of FIG. 12, is surrounded by the active regions 18), and each side of the doping layer 16 is parallel to a line connecting a pair of active regions 18.

In some nonlimiting illustrative embodiments, the separation between the edge of the active region 18 and the doped region 16 (e.g., the distance a indicated in FIGS. 1, 2, and 4) is in a range of 0.1 microns to 100 microns. The choice of separation may depend on factors such as the width of the depletion regions 31, 32, 33, 34 (see FIG. 4 and related discussion). In some nonlimiting illustrative embodiments, the width of each active region 18 is greater than or equal to 0.01 microns. In some nonlimiting illustrative embodiments, the distance between the active regions 18 of a pair (indicated as d1 in FIG. 2) is greater than or equal to 0.01 microns. These are merely some nonlimiting illustrative dimensions.

In the following, some further embodiments are described.

In a nonlimiting illustrative embodiment, a method of fabricating at least one integrated circuit (IC) is disclosed. The method comprises: forming doped regions on a semiconductor wafer using a first photolithography mask including a doped region of a test structure having mutually parallel first and second sides oriented along a first direction, and mutually parallel third and fourth sides oriented along a second direction that is perpendicular to the first direction; forming active regions on the semiconductor wafer using a second photolithography mask including active regions of the test structure; performing a wafer acceptance test (WAT) to determine at least one WAT metric; and, in response to the at least one WAT metric indicating the doped regions are spatially aligned with the active regions, completing fabrication of the at least one IC. The WAT includes: measuring a first electrical resistance ($R_{top}$) along the first side of the doped region of the test structure using a first pair of the active regions of the test structure; measuring a second electrical resistance ($R_{bot}$) along the second side of the doped region of the test structure using a second pair of the active regions of the test structure; measuring a third electrical resistance ($R_{left}$) along the third side of the doped region of the test structure using a third pair of the active regions of the test structure; measuring a fourth electrical resistance ($R_{right}$) along the fourth side of the doped region of the test structure using a fourth pair of the active regions of the test structure; and determining the at least one WAT metric indicating whether the doped regions are spatially aligned with the active regions based on the measured electrical resistances ($R_{top}$, $R_{bot}$, $R_{left}$, $R_{right}$).

In a nonlimiting illustrative embodiment, a method of fabricating at least one IC is disclosed. The method comprises: forming doped regions on a semiconductor wafer using a first photolithography mask including at least one doped region of a test structure; forming active regions on the semiconductor wafer using a second photolithography mask including active regions of the test structure; forming electrical contacts on the active regions of the test structure; measuring electrical resistances between pairs of active regions of the test structure using the electrical contacts; determining at least one wafer acceptance test (WAT) metric indicating whether the doped regions are spatially aligned with the active regions based on the measured electrical resistances; and, in response to the at least one WAT metric indicating the doped regions are spatially aligned with the active regions, completing fabrication of the at least one IC.

In a nonlimiting illustrative embodiment, a test structure comprises a doped region and active regions. The doped region is formed on and/or in a base semiconductor material. The doped region has a perimeter with mutually parallel first and second sides oriented along a first direction, and mutually parallel third and fourth sides oriented along a second direction that is perpendicular to the first direction. The active regions are formed on and/or in the base semiconductor material with a first pair of the active regions disposed along the first side of the perimeter of the doped region, a second pair of the active regions disposed along the second side of the perimeter of the doped region, a third pair of the active regions disposed along the third side of the perimeter of the doped region, and a fourth pair of the active region disposed along the fourth side of the perimeter of the doped region. In some embodiments, the base semiconductor material is n-type, the doped region is p-type, and the active regions are n-type and have a higher n-type doping level than the base semiconductor material. In some other embodiments, the base semiconductor material is p-type, the doped region is n-type, and the active regions are p-type and have a higher p-type doping level than the p-type base semiconductor material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating at least one integrated circuit (IC), the method comprising:
   forming doped regions on a semiconductor wafer using a first photolithography mask including a doped region of a test structure having mutually parallel first and second sides oriented along a first direction, and mutually parallel third and fourth sides oriented along a second direction that is perpendicular to the first direction;
   forming active regions on the semiconductor wafer using a second photolithography mask including active regions of the test structure;
   performing a wafer acceptance test (WAT) including:
      measuring a first electrical resistance ($R_{top}$) along the first side of the doped region of the test structure using a first pair of the active regions of the test structure;
      measuring a second electrical resistance ($R_{bot}$) along the second side of the doped region of the test structure using a second pair of the active regions of the test structure;
      measuring a third electrical resistance ($R_{left}$) along the third side of the doped region of the test structure using a third pair of the active regions of the test structure;
      measuring a fourth electrical resistance ($R_{right}$) along the fourth side of the doped region of the test structure using a fourth pair of the active regions of the test structure; and
      determining at least one WAT metric indicating whether the doped regions are spatially aligned with the active regions based on the measured electrical resistances ($R_{top}$, $R_{bot}$, $R_{left}$, $R_{right}$); and
   in response to the at least one WAT metric indicating the doped regions are spatially aligned with the active regions, completing fabrication of the at least one IC.

2. The method of claim 1, wherein one of:
   (i) the doped regions are p-type and are formed in and/or on an n-type base semiconductor material, and the active regions are n-type and are formed in and/or on the n-type base semiconductor material and have a higher n-type doping level than the n-type base semiconductor material; or
   (ii) the doped regions are n-type and are formed in and/or on a p-type base semiconductor material, and the active regions are p-type and are formed in and/or on the p-type base semiconductor material and have a higher p-type doping level than the p-type base semiconductor material.

3. The method of claim 2, wherein:
   the formed active regions further include source and drain regions of transistors of the IC; and
   the formed doped regions further include isolation regions formed between the transistors of the IC.

4. The method of claim 1, wherein the forming of the doped regions using the first photolithography mask is performed before the forming of the active regions using the second photolithography mask.

5. The method of claim 1, wherein the determining of the at least one WAT metric includes:
   determining a first WAT metric as a difference between the first electrical resistance ($R_{top}$) and the second electrical resistance ($R_{bot}$);
   determining a second WAT metric as a difference between the third electrical resistance ($R_{left}$) and the fourth electrical resistance ($R_{right}$).

6. The method of claim 5, wherein:
   the first WAT metric indicates whether the doped regions are spatially aligned with the active regions along the second direction based on whether the first WAT metric is within a first threshold; and
   the second WAT metric indicates whether the doped regions are spatially aligned with the active regions along the first direction based on whether the second WAT metric is within a second threshold.

7. The method of claim 1, further comprising:
   forming electrical contacts on the active regions of the test structure;
   after the electrical contacts are formed on the active regions, forming at least one patterned metallization layer spaced apart from the electrical contacts by a dielectric material and electrically conductive vias passing through the dielectric material and connecting the electrical contacts formed on the active regions with the at least one patterned metallization layer;
   wherein the measuring operations are performed using the metallization layer electrically connected with the electrical contacts by the vias passing through the dielectric material.

8. The method of claim 1, wherein first, second, third, and fourth sides of the doped region of the test structure form a square inner perimeter of the doped region of the test structure, and the active regions of the test structure comprise four active regions disposed at four respective corners inside the square inner perimeter.

9. A method of fabricating at least one integrated circuit (IC), the method comprising:
   forming doped regions on a semiconductor wafer using a first photolithography mask including at least one doped region of a test structure;
   forming active regions on the semiconductor wafer using a second photolithography mask including active regions of the test structure;
   forming electrical contacts on the active regions of the test structure;
   measuring electrical resistances between pairs of active regions of the test structure using the electrical contacts;
   determining at least one wafer acceptance test (WAT) metric indicating whether the doped regions are spatially aligned with the active regions based on the measured electrical resistances; and
   in response to the at least one WAT metric indicating the doped regions are spatially aligned with the active regions, completing fabrication of the at least one IC.

10. The method of claim 9, wherein one of:
    (i) the doped regions are p-type and are formed in and/or on an n-type base semiconductor material, and the active regions are n-type and are formed in and/or on the n-type base semiconductor material and have a higher n-type doping level than the n-type base semiconductor material; or
    (ii) the doped regions are n-type and are formed in and/or on a p-type base semiconductor material, and the active regions are p-type and are formed in and/or on the p-type base semiconductor material and have a higher p-type doping level than the p-type base semiconductor material.

11. The method of claim 9, wherein the at least one doped region has a regular polygon perimeter, and the active regions of the test structure are disposed adjacent the regular polygon perimeter.

12. The method of claim 11, wherein the regular polygon perimeter is a square perimeter, and the active regions of the test structure are disposed inside or outside the square perimeter.

13. The method of claim 12, wherein the determining of the at least one WAT metric includes computing differences between electrical resistances measured between pairs of active regions of the test structure on opposite sides of the square perimeter.

14. The method of claim 12, wherein the square perimeter has sides parallel with an X-direction and sides parallel with a Y-direction that is perpendicular to the X-direction, and the determining of the at least one WAT metric includes:
computing a difference $\Delta R_x$ between an electrical resistance measured between a first pair of active regions that are spaced apart along a first side of the square perimeter that is parallel with the Y-direction and a second pair of active regions that are spaced apart along a second side of the square perimeter that is parallel with the Y-direction; and
computing a difference $\Delta R_y$ between an electrical resistance measured between a first pair of active regions that are spaced apart along a first side of the square perimeter that is parallel with the X-direction and a second pair of active regions that are spaced apart along a second side of the square perimeter that is parallel with the X-direction; and
the at least one WAT metric includes a first WAT metric dependent on $\Delta R_x$ that indicates whether the doped regions are spatially aligned with the active regions along the X-direction, and a second WAT metric dependent on $\Delta R_y$ that indicates whether the doped regions are spatially aligned with the active regions along the Y-direction.

15. The method of claim 11, wherein the regular polygon perimeter is a regular hexagon perimeter, and the active regions of the test structure are disposed inside or outside the regular hexagon perimeter.

16. The method of claim 9, further comprising:
after the electrical contacts are formed on the active regions, forming at least one patterned metallization layer spaced apart from the electrical contacts by a dielectric material and electrically conductive vias passing through the dielectric material and connecting the electrical contacts formed on the active regions with the at least one patterned metallization layer;
wherein the electrical resistances between the pairs of active regions of the test structure are measured using the metallization layer electrically connected with the electrical contacts by the vias passing through the dielectric material.

17. The method of claim 9, wherein:
the formed doped regions further include doped regions of an array of IC chips and the formed active regions further include active regions of the array of IC chips, and the test structure includes a plurality of test structures disposed on the semiconductor wafer outside of areas of the IC chips; and
the completing fabrication of the at least one IC includes at least dicing the semiconductor wafer to separate the IC chips.

18. The method of claim 9, wherein one of:
the forming of the doped regions using the first photolithography mask is performed before the forming of the active regions using the second photolithography mask; or
the forming of the active regions using the second photolithography mask is performed before the forming of the doped regions using the first photolithography mask.

19. The method of claim 9, wherein:
the forming of the doped regions using the first photolithography mask is performed before the forming of the active regions using the second photolithography mask;
the forming of the doped regions using the first photolithography mask includes forming a first patterned photoresist layer on the semiconductor wafer using the first photolithography mask and subsequently forming the doped regions by ion implantation of a first dopant species through openings in the first patterned photoresist layer; and
wherein the forming of the active regions using the second photolithography mask includes forming a second patterned photoresist layer on the semiconductor wafer using the second photolithography mask and subsequently forming the active regions by disposing a second dopant species on the semiconductor wafer through openings in the second patterned photoresist layer.

20. A test structure comprising:
a doped region formed on and/or in a base semiconductor material, the doped region having a perimeter with mutually parallel first and second sides oriented along a first direction, and mutually parallel third and fourth sides oriented along a second direction that is perpendicular to the first direction;
active regions formed on and/or in the base semiconductor material with a first pair of the active regions disposed along the first side of the perimeter of the doped region, a second pair of the active regions disposed along the second side of the perimeter of the doped region, a third pair of the active regions disposed along the third side of the perimeter of the doped region, and a fourth pair of the active region disposed along the fourth side of the perimeter of the doped region;
wherein one of:
(i) the base semiconductor material is n-type, the doped region is p-type, and the active regions are n-type and have a higher n-type doping level than the base semiconductor material; or
(ii) the base semiconductor material is p-type, the doped region is n-type, and the active regions are p-type and have a higher p-type doping level than the p-type base semiconductor material.

* * * * *